(12) United States Patent
Noda et al.

(10) Patent No.: US 6,559,779 B2
(45) Date of Patent: May 6, 2003

(54) DATA ENCODING METHOD, APPARATUS, AND STORAGE MEDIUM

(75) Inventors: Chosaku Noda, Kawasaki (JP); Yoshiyuki Ishizawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/084,052

(22) Filed: Feb. 28, 2002

(65) Prior Publication Data

US 2002/0118125 A1 Aug. 29, 2002

(30) Foreign Application Priority Data

Feb. 28, 2001 (JP) ........................................ 2001-055529

(51) Int. Cl.[7] ................................................ H03M 5/00
(52) U.S. Cl. ............................... 341/58; 341/59; 341/61
(58) Field of Search ........................... 341/58, 50, 51, 341/59, 60, 68, 61, 95, 106

(56) References Cited

U.S. PATENT DOCUMENTS

| | | | | |
|---|---|---|---|---|
| 4,833,470 A | * | 5/1989 | Iketani | 341/59 |
| 5,757,296 A | * | 5/1998 | Ishizawa | 341/95 |
| 6,229,459 B1 | * | 8/2001 | Noda | 341/59 |

FOREIGN PATENT DOCUMENTS

JP        56-149152        11/1981

* cited by examiner

*Primary Examiner*—Brian Young
*Assistant Examiner*—John Nguyen
(74) *Attorney, Agent, or Firm*—Oblon, Spivak, McClelland, Maier & Neustadt, P.C.

(57) ABSTRACT

To convert a 12-bit data word into an 18-bit code word, the 12-bit data word is divided into the 8 high-order bits and the 4 low-order bits. The 8 high-order bits are converted into 12 bits and the 4 low-order bits are converted into 6 bits, thereby creating an 18-bit code. This enables conversion using small-scale conversion tables.

22 Claims, 10 Drawing Sheets

Example of 18-bit patterns where the number of consecutive "0s" is limited to one or more and eleven or less

| Number | Bit pattern | Number | Bit pattern | Number | Bit pattern |
|---|---|---|---|---|---|
| 1 | 000000010000000000 | 31 | 101001010000000000 | 6661 | 000010100101010101 |
| 2 | 100000010000000000 | 32 | 000101010000000000 | 6662 | 100010100101010101 |
| 3 | 010000010000000000 | 33 | 100101010000000000 | 6663 | 010010100101010101 |
| 4 | 001000010000000000 | 34 | 010101010000000000 | 6664 | 001010100101010101 |
| 5 | 101000010000000000 | 35 | 000000001000000000 | 6665 | 101010100101010101 |
| 6 | 000100010000000000 | 36 | 100000001000000000 | 6666 | 000000010101010101 |
| 7 | 100100010000000000 | 37 | 010000001000000000 | 6667 | 100000010101010101 |
| 8 | 010100010000000000 | 38 | 001000001000000000 | 6668 | 010000010101010101 |
| 9 | 000010010000000000 | 39 | 101000001000000000 | 6669 | 001000010101010101 |
| 10 | 100010010000000000 | 40 | 000100001000000000 | 6670 | 101000010101010101 |
| 11 | 010010010000000000 | 41 | 100100001000000000 | 6671 | 000100010101010101 |
| 12 | 001010010000000000 | 42 | 010100001000000000 | 6672 | 100100010101010101 |
| 13 | 101010010000000000 | 43 | 000010001000000000 | 6673 | 010100010101010101 |
| 14 | 000000010000000000 | 44 | 100010001000000000 | 6674 | 000010010101010101 |
| 15 | 100000010000000000 | 45 | 010010001000000000 | 6675 | 100010010101010101 |
| 16 | 010000010000000000 | 46 | 001010001000000000 | 6676 | 010010010101010101 |
| 17 | 001000010000000000 | 47 | 101010001000000000 | 6677 | 001010010101010101 |
| 18 | 101000010000000000 | 48 | 000001001000000000 | 6678 | 101010010101010101 |
| 19 | 000100010000000000 | 49 | 100001001000000000 | 6679 | 000001010101010101 |
| 20 | 100100010000000000 | 50 | 010001001000000000 | 6680 | 100001010101010101 |
| 21 | 010100010000000000 | 51 | 001001001000000000 | 6681 | 010001010101010101 |
| 22 | 000010010000000000 | 52 | 101001001000000000 | 6682 | 001001010101010101 |
| 23 | 100010010000000000 | 53 | 000101001000000000 | 6683 | 101001010101010101 |
| 24 | 010010010000000000 | 54 | 100101001000000000 | 6684 | 000101010101010101 |
| 25 | 001010010000000000 | 55 | 010101001000000000 | 6685 | 100101010101010101 |
| 26 | 101010010000000000 | 56 | 000000101000000000 | 6686 | 010101010101010101 |
| 27 | 000001010000000000 | 57 | 100000101000000000 | | |
| 28 | 100001010000000000 | 58 | 010000101000000000 | | |
| 29 | 010001010000000000 | 59 | 001000101000000000 | | |
| 30 | 001001010000000000 | 60 | 101000101000000000 | | |

FIG. 1

FIG. 2 — Method of converting a 12-bit data word into an 18-bit code word

FIG. 4 — Example of patterns fulfilling the conditions for conversion table B

| Number | Bit pattern |
|---|---|
| 1 | 00000* |
| 2 | 000010 |
| 3 | 00010* |
| 4 | 00100* |
| 5 | 001010 |
| 6 | 01000* |
| 7 | 010010 |
| 8 | 01010* |
| 9 | 10000* |
| 10 | 100010 |
| 11 | 10010* |
| 12 | 10100* |
| 13 | 101010 |

Example of patterns fulfilling the conditions for conversion table A

| Number | Bit pattern | Number | Bit pattern | Number | Bit pattern |
|---|---|---|---|---|---|
| 1 | 100000000000 | 31 | 010010100000 | 361 | 100100010101 |
| 2 | 010000000000 | 32 | 001010100000 | 362 | 010100010101 |
| 3 | 001000000000 | 33 | 101010100000 | 363 | 000010010101 |
| 4 | 101000000000 | 34 | 000000010000 | 364 | 100010010101 |
| 5 | 000100000000 | 35 | 100000010000 | 365 | 010010010101 |
| 6 | 100100000000 | 36 | 010000010000 | 366 | 001010010101 |
| 7 | 010100000000 | 37 | 001000010000 | 367 | 101010010101 |
| 8 | 000010000000 | 38 | 101000010000 | 368 | 000001010101 |
| 9 | 100010000000 | 39 | 000100010000 | 369 | 100001010101 |
| 10 | 010010000000 | 40 | 100100010000 | 370 | 010001010101 |
| 11 | 001010000000 | 41 | 010100010000 | 371 | 001001010101 |
| 12 | 101010000000 | 42 | 000010010000 | 372 | 101001010101 |
| 13 | 000001000000 | 43 | 100010010000 | 373 | 000101010101 |
| 14 | 100001000000 | 44 | 010010010000 | 374 | 100101010101 |
| 15 | 010001000000 | 45 | 001010010000 | 375 | 010101010101 |
| 16 | 001001000000 | 46 | 101010010000 | | |
| 17 | 101001000000 | 47 | 000001010000 | | |
| 18 | 000101000000 | 48 | 100001010000 | | |
| 19 | 100101000000 | 49 | 010001010000 | | |
| 20 | 010101000000 | 50 | 001001010000 | | |
| 21 | 000000100000 | 51 | 101001010000 | | |
| 22 | 100000100000 | 52 | 000101010000 | | |
| 23 | 010000100000 | 53 | 100101010000 | | |
| 24 | 001000100000 | 54 | 010101010000 | | |
| 25 | 101000100000 | 55 | 000000001000 | | |
| 26 | 000100100000 | 56 | 100000001000 | | |
| 27 | 100100100000 | 57 | 010000001000 | | |
| 28 | 010100100000 | 58 | 001000001000 | | |
| 29 | 000010100000 | 59 | 101000001000 | | |
| 30 | 100010100000 | 60 | 000100001000 | | |

FIG. 3

Example of patterns fulfilling the
condition for conversion table A-1

| Number | Bit pattern | Number | Bit pattern | Number | Bit pattern |
|---|---|---|---|---|---|
| 1 | 000000100000 | 31 | 101001010000 | 181 | 010000001010 |
| 2 | 100000100000 | 32 | 000101010000 | 182 | 001000001010 |
| 3 | 010000100000 | 33 | 100101010000 | 183 | 101000001010 |
| 4 | 001000100000 | 34 | 010101010000 | 184 | 000100001010 |
| 5 | 101000100000 | 35 | 000000001000 | 185 | 100100001010 |
| 6 | 000100100000 | 36 | 100000001000 | 186 | 010100001010 |
| 7 | 100100100000 | 37 | 010000001000 | 187 | 000010001010 |
| 8 | 010100100000 | 38 | 001000001000 | 188 | 100010001010 |
| 9 | 000010100000 | 39 | 101000001000 | 189 | 010010001010 |
| 10 | 100010100000 | 40 | 000100001000 | 190 | 001010001010 |
| 11 | 010010100000 | 41 | 100100001000 | 191 | 101010001010 |
| 12 | 001010100000 | 42 | 010100001000 | 192 | 000001001010 |
| 13 | 101010100000 | 43 | 000010001000 | 193 | 100001001010 |
| 14 | 000000010000 | 44 | 100010001000 | 194 | 010001001010 |
| 15 | 100000010000 | 45 | 010010001000 | 195 | 001001001010 |
| 16 | 010000010000 | 46 | 001010001000 | 196 | 101001001010 |
| 17 | 001000010000 | 47 | 101010001000 | 197 | 000101001010 |
| 18 | 101000010000 | 48 | 000001001000 | 198 | 100101001010 |
| 19 | 000100010000 | 49 | 100001001000 | 199 | 010101001010 |
| 20 | 100100010000 | 50 | 010001001000 | 200 | 000000101010 |
| 21 | 010100010000 | 51 | 001001001000 | 201 | 100000101010 |
| 22 | 000010010000 | 52 | 101001001000 | 202 | 010000101010 |
| 23 | 100010010000 | 53 | 000101001000 | 203 | 001000101010 |
| 24 | 010010010000 | 54 | 100101001000 | 204 | 101000101010 |
| 25 | 001010010000 | 55 | 010101001000 | 205 | 000100101010 |
| 26 | 101010010000 | 56 | 000000101000 | 206 | 100100101010 |
| 27 | 000001010000 | 57 | 100000101000 | 207 | 010100101010 |
| 28 | 100001010000 | 58 | 010000101000 | 208 | 000010101010 |
| 29 | 010001010000 | 59 | 001000101000 | 209 | 100010101010 |
| 30 | 001001010000 | 60 | 101000101000 | 210 | 010010101010 |
|  |  |  |  | 211 | 001010101010 |
|  |  |  |  | 212 | 101010101010 |

FIG. 5

Example of patterns fulfilling the
condition for conversion table A-2

| Number | Bit pattern | Number | Bit pattern | Number | Bit pattern |
|---|---|---|---|---|---|
| 1 | 100000000001 | 31 | 010010100001 | 121 | 000000010101 |
| 2 | 010000000001 | 32 | 001010100001 | 122 | 100000010101 |
| 3 | 001000000001 | 33 | 101010100001 | 123 | 010000010101 |
| 4 | 101000000001 | 34 | 000000010001 | 124 | 001000010101 |
| 5 | 000100000001 | 35 | 100000010001 | 125 | 101000010101 |
| 6 | 100100000001 | 36 | 010000010001 | 126 | 000100010101 |
| 7 | 010100000001 | 37 | 001000010001 | 127 | 100100010101 |
| 8 | 000010000001 | 38 | 101000010001 | 128 | 010100010101 |
| 9 | 100010000001 | 39 | 000100010001 | 129 | 000010010101 |
| 10 | 010010000001 | 40 | 100100010001 | 130 | 100010010101 |
| 11 | 001010000001 | 41 | 010100010001 | 131 | 010010010101 |
| 12 | 101010000001 | 42 | 000010010001 | 132 | 001010010101 |
| 13 | 000001000001 | 43 | 100010010001 | 133 | 000001010101 |
| 14 | 100001000001 | 44 | 010010010001 | 134 | 100001010101 |
| 15 | 010001000001 | 45 | 001010010001 | 135 | 010001010101 |
| 16 | 001001000001 | 46 | 101010010001 | 136 | 001001010101 |
| 17 | 101001000001 | 47 | 000001010001 | 137 | 000101010101 |
| 18 | 000101000001 | 48 | 100001010001 | 138 | 101010101001 |
| 19 | 100101000001 | 49 | 010001010001 | 139 | 101010100101 |
| 20 | 010101000001 | 50 | 001001010001 | 140 | 101010010101 |
| 21 | 000000100001 | 51 | 101001010001 | 141 | 101001010101 |
| 22 | 100000100001 | 52 | 000101010001 | 142 | 100101010101 |
| 23 | 010000100001 | 53 | 100101010001 | 143 | 010101010101 |
| 24 | 001000100001 | 54 | 010101010001 | | |
| 25 | 101000100001 | 55 | 000000001001 | | |
| 26 | 000100100001 | 56 | 100000001001 | | |
| 27 | 100100100001 | 57 | 010000001001 | | |
| 28 | 010100100001 | 58 | 001000001001 | | |
| 29 | 000010100001 | 59 | 101000001001 | | |
| 30 | 100010100001 | 60 | 000100001001 | | |

FIG. 6

Example of patterns fulfilling the condition for conversion table A-3

| Number | Bit pattern |
|---|---|
| 1 | 000010000000 |
| 2 | 100010000000 |
| 3 | 010010000000 |
| 4 | 001010000000 |
| 5 | 101010000000 |
| 6 | 000001000000 |
| 7 | 100001000000 |
| 8 | 010001000000 |
| 9 | 001001000000 |
| 10 | 101001000000 |
| 11 | 000101000000 |
| 12 | 100101000000 |
| 13 | 010101000000 |

FIG. 7

Example of patterns fulfilling the condition for conversion table A-4

| Number | Bit pattern |
|---|---|
| 1 | 000010000000 |
| 2 | 100100000000 |
| 3 | 010100000000 |

FIG. 8

Example of patterns fulfilling the condition for conversion table A-5

| Number | Bit pattern |
|---|---|
| 1 | 001000000000 |
| 2 | 101000000000 |

FIG. 9

Example of patterns fulfilling the condition for conversion table A-6

| Number | Bit pattern |
|---|---|
| 1 | 010000000000 |

FIG. 10

Example of patterns fulfilling the condition for conversion table A-7

| Number | Bit pattern |
|---|---|
| 1 | 100000000000 |

FIG. 11

Combinations of patterns in conversion table A and conversion table B and the number of combinations

| Conversion table A | Conversion table B | Number of combinations of patterns |
|---|---|---|
| Conversion table A-1 (212 patterns) | 00000*, 000010, 00010*, 00100*, 001010, 01000*, 010010, 01010*, 10000*, 100010, 10010*, 10100*, 101010 | 2756 |
| Conversion table A-2 (143 patterns) | 00000*, 000010, 00010*, 00100*, 001010, 01000*, 010010, 01010* | 1144 |
| Conversion table A-3 (13 patterns) | 000010, 00010*, 00100*, 001010, 01000*, 010010, 01010*, 10000*, 100010, 10010*, 10100*, 101010 | 156 |
| Conversion table A-4 (3 patterns) | 00010*, 00100*, 001010, 01000*, 010010, 01010*, 10000*, 100010, 10010*, 10100*, 101010 | 33 |
| Conversion table A-5 (2 patterns) | 00100*, 001010, 01000*, 010010, 01010*, 10000*, 100010, 10010*, 10100*, 101010 | 20 |
| Conversion table A-6 (1 pattern) | 01000*, 010010, 01010*, 10000*, 100010, 10010*, 10100*, 101010 | 8 |
| Conversion table A-7 (1 pattern) | 10000*, 100010, 10010*, 10100*, 101010 | 5 |

FIG. 12

Combinations of the patterns to be removed from conversion tables

| Number | Conversion table A | Conversion table B |
|---|---|---|
| 1 | 101010101010 | 00000* |
| 2 | 101010101010 | 000010 |
| 3 | 101010101010 | 00010* |
| 4 | 101010101010 | 00100* |
| 5 | 101010101010 | 001010 |
| 6 | 101010101010 | 01000* |
| 7 | 101010101010 | 010010 |
| 8 | 101010101010 | 01010* |
| 9 | 101010101010 | 10000* |
| 10 | 101010101010 | 100010 |
| 11 | 101010101010 | 10010* |
| 12 | 101010101010 | 10100* |
| 13 | 101010101010 | 101010 |
| 14 | 000010101010 | 101010 |
| 15 | 001010101010 | 101010 |
| 16 | 010010101010 | 101010 |
| 17 | 100010101010 | 101010 |

FIG. 14

DATA ENCODING METHOD, APPARATUS, AND STORAGE MEDIUM

CROSS-REFERENCE TO RELATED APPLICATIONS

This application is based upon and claims the benefit of priority from the prior Japanese Patent Application No. 2001-055529, filed Feb. 28, 2001, the entire contents of which are incorporated herein by reference.

BACKGROUND OF THE INVENTION

1. Field of the Invention

This invention relates to a data encoding method, apparatus, and storage medium. The invention is relates to an apparatus which records digital data onto a storage medium, such as an optical disk, or reproduces the recorded data. The invention further relates to a data encoding method and apparatus suitable for the conversion of digital data into bit sequences to be recorded onto a storage medium, and to a storage medium on which data is to be recorded or has been recorded.

2. Description of the Related Art

To record digital data onto an optical disk or the like, bit sequences of digital data are required to have various characteristics. The bit sequences recorded on a playback-only optical disk are expressed as bumps or pits on the reflecting surface. In a recordable magnet-optical disk, recorded bit sequences are expressed as sequences of magnetized marks. In a phase change disk, recorded bit sequences are expressed as sequences of marks with optical constants.

The disk manufacturing processes are required to be easy. The optical characteristics in reading with a laser beam are needed to be good. The characteristics in reproducing the digital data from the read-out signal must also be good. Therefore, it is necessary to convert the recording data into bit sequences that satisfy the above requirements. That is, an encoding process must be carried out.

When the recorded minimum pit length is small, if the optical characteristics deteriorate, the output of the reproduced signal decreases significantly. Thus, it is desirable that the minimum pit length should be great. Conversely, if the maximum pit length is great, the number of inversions of the reproduced signal decreases. This makes the timing for reproducing the clock unstable, making jitters in the clock larger. As a result, code errors in the reproduced signal are liable to occur. Therefore, it is desirable that the maximum pit length should be small.

It is also important that the direct-current (DC) component and low-frequency components of the recording signal are small. These signal components might affect the tracking servo that traces the track formed on the optical disk. To read the signal accurately, it is necessary to suppress those signal components. Another requirement is that the sensing window width should be wide. If the original data was converted into many bits and recording took place, phase allowance in time during sensing would become smaller, even when the pit length condition was satisfied. At the same time, the reproducing clock frequency would become higher.

One encoding method taking these conditions into account is the 8/14 encoding method disclosed in, for example, Jpn. Pat. Appln. KOKAI Publication No. 6-284015. The 8/14 encoding method is an encoding method of converting 8-bit data into 14-bit code.

In this method, a plurality of tables for code conversion are used and switching is done between the tables in such a manner that the value (DSV: digital sum value) accumulated, taking bit "0" as "−1" and bit "1" as "+1" in a recording bit sequence, becomes smaller. This makes it possible to suppress the direct-current component and low-frequency components sufficiently.

On the other hand, since the number of bits after the encoding increases to 14/8 times the number of bits in the original data, this makes the sensing window width smaller and increases the clock frequency at the same rate. In recent years, digital recording apparatuses have been required to have higher data transfer speeds. Increases in the data recording and reproducing speeds increase the clock frequency, which might be an obstacle to configuring a signal processing circuit.

Another encoding method has been disclosed in, for example, Jpn. Pat. Appln. KOKAI Publication No. 56-149152. In the encoding-method, the data is converted into a code containing as many as 1.5 times the number of bits in the data. Since the number of consecutive bits "0s" between bits "1s" is one or more and seven or less, this type of method is generally called (1, 7) RLL coding.

This method is characterized in that a signal processing circuit can be configured using a small circuit and a relatively low clock frequency. Since this method does not manage the DSV at all, as in the 8/14 method, the direct-current component and low-frequency components cannot be suppressed. Thus, in this method, the tracking performance might be affected. To avoid this phenomenon, it is necessary to insert adjustment bits in addition to the recording data to make the DSV smaller. When such adjustment bits are inserted, the number of redundant bits on the medium increases. This causes a new problem: the storage capacity of the original data decreases. There is another problem: since variable-length coding includes the conversion of 2 bits into 3 bits and the conversion of 4 bits into 6 bits, bit errors are liable to propagate.

As described above, in the conventional encoding methods, suppressing the low-frequency components permits the clock frequency to rise, whereas decreasing the clock frequency to a low level makes it impossible to suppress the low frequency components. There is still another problem: adding adjustment bits increases the number of redundant bits, which decreases the storage capacity of the original data on a storage medium.

BRIEF SUMMARY OF THE INVENTION

It is an object of the present invention to provide a data encoding method and a data encoding apparatus which need not raise the recording clock frequency too much and can suppress the low-frequency components without using adjustment bits, and a storage medium.

According to an aspect of the present invention, there is provided a data encoding method of converting an L-bit data word into an αL-bit code word, comprising: dividing the L-bit data word into an M-bit data word and an N-bit data word (M≧N); converting the M-bit data word into a βM-bit code word by reference to a first conversion table; converting the N-bit data word into a γN-bit code word by reference to a second conversion table; and connecting the βM-bit code word to the γN-bit code word to convert into the αL-bit code word.

Whether to select either the first or the second conversion table is determined by a combination of the M-bit data word and the N-bit data word.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 shows an example of an 18-bit pattern where the number of consecutive "0s" is limited to one or more and eleven or less;

FIG. 3 shows a pattern that satisfies the condition for conversion table A used for the converting process in FIG. 2;

FIG. 4 shows a pattern that satisfies the condition for conversion table B used for the converting process in FIG. 2;

FIG. 5 shows a pattern that satisfies the condition for conversion table A-1 included in conversion table A;

FIG. 6 shows a pattern that satisfies the condition for conversion table A-2 included in conversion table A;

FIG. 7 shows a pattern that satisfies the condition for conversion table A-3 included in conversion table A;

FIG. 8 shows a pattern that satisfies the condition for conversion table A-4 included in conversion table A;

FIG. 9 shows a pattern that satisfies the condition for conversion table A-5 included in conversion table A;

FIG. 10 shows a pattern that satisfies the condition for conversion table A-6 included in conversion table A;

FIG. 11 shows a pattern that satisfies the condition for conversion table A-7 included in conversion table A;

FIG. 12 is a table listing combinations of the patterns in conversion table A and conversion table B and the number of combinations;

FIG. 14 is a table listing combinations of the patters to be removed from the conversion tables A and B;

DETAILED DESCRIPTION OF THE INVENTION

Figure 2:
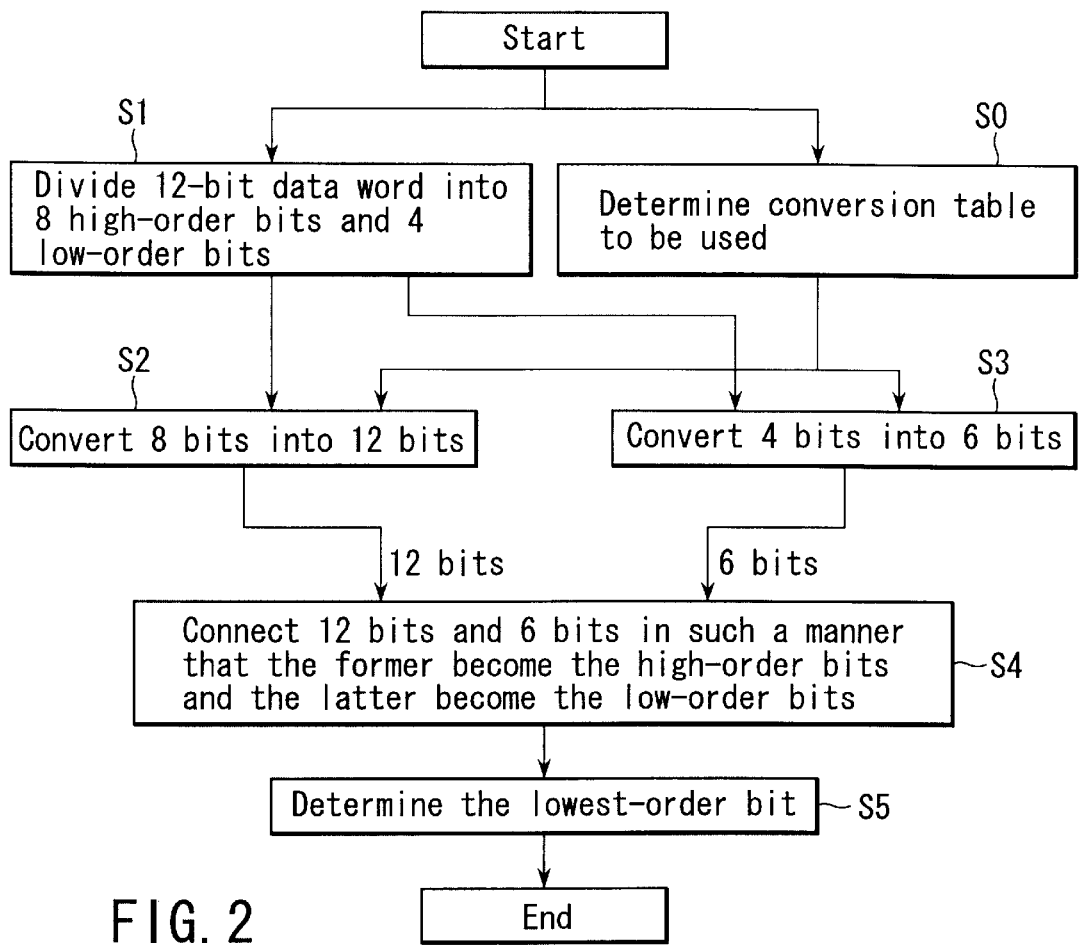
FIG. 2 shows a method of converting a 12-bit data word into an 18-bit code word.

Hereinafter, referring to the accompanying drawings, an embodiment of the present invention will be expelled.

The basic concept of the present invention will be explained. In this invention, the size of a data word may take various values. For the sake of an example, a detailed explanation will be given about an embodiment where the invention is applied to the 12/18 modulation method that converts a 12-bit data word into an 18-bit code word.

The original data to be encoded contains 12 bits. The number of bit patterns represented by the 12 bits is 4096. The code after encoding contains 18 bits. The number of bit patters represented by the 18 bits is 262144. Here, the encoding process corresponds to the process of allocating words between the 4096 patterns and the 262144 patterns.

The primary conditions required for the encoding method are summarized again as follows: 1) the minimum pit length must be great, 2) the maximum pit length must be small, 3) the direct-current component and low-frequency components must be less in the recording signal, 4) the sensing window width must be great, and 5) the reproducing clock frequency is low.

To meet the conditions of item 1) and item 2), consider, as the bit patterns of a code, combinations that satisfy the condition for (1, 11) RLL where the number of consecutive bits "0s" between bits "1" is limited to one or more and eleven or less.

Under the condition for a code word alone, the number of 18-bit patterns that fulfill (1, 11) RLL is 6686 in total.

FIG. 1 shows an example of the bit patterns. Since the number of patterns that satisfy the conditions exceeds the number of patterns (4096) expressed by 12 bits, the code conversion of 12 bits into 18 bits is sufficiently possible.

However, when the 18-bit codes after conversion are connected consecutively, the condition for (1, 11) RLL may not be fulfilled at the boundary between the codes. When any two codes are connected to each other, there may be combinations where bits "1s" might be consecutive at the boundary between the codes or more than 12 bits "0s" might be consecutive.

To avoid those combinations, the following restrictions are imposed on the bit patterns of FIG. 1 so that the condition for (1, 11) RLL may be fulfilled even at the junction of the codes: the bit pattern must be such that the number of consecutive bits "0s" at the head of a code is five or less and the number of consecutive bits "0s" at the end of the code is one or more and six or less.

Adding this condition decreases the number of possible codes to 3710. Therefore, even when such codes are connected, it is not easy to satisfy the condition for (1, 11) RLL.

Even if a conversion table is obtained, the direct conversion of 12-bit data into an 18-bit code requires a conversion table which has a capacity of $$4094 \times 18 \text{ bits} = 73728 \text{ bits or more.}$$

Thus, a lot of memory is needed for the conversion process.

In the embodiment, to overcome this problem, 12 bits of data are divided into two, the high-order bits and the low-order bits. At the same time, the high-order bits and the low-order bits are converted into codes using the conversion table. The codes after the conversion are connected, thereby making the conversion table smaller.

FIG. 2 is a diagram to help give a brief explanation of the converting method.

The inputted 12 bits of data are first divided into the 8 high-order bits and the 4 lower-order bits (step S1).

The 8 high-order bits are converted into a 12-bit code using conversion table A (step S2). On the other hand, the 4 low-order bits are converted into a 6-bit code using conversion table B (step S3).

The 12-bit code converted with conversion table A is connected to the 6-bit code converted with conversion table B in such a manner that the former becomes the high order and the latter becomes the low order. As a result, an 18-bit code is outputted (step S4).

Each of the conversion tables A and B includes a plurality of tables. Of these tables, the one to be used is selected, depending on the output of a table select section C. Twelve bits of data are inputted to the table select section C. According to a predetermined decode rule, the table select section C outputs conversion table select information for determining a table to be used (step S0).

That is, the table select section C controls conversion table A and conversion table B, thereby determining a code combination pattern. Codes are combined to form a code word.

The connected 18-bit code includes some selectable codes as the low-order bits. These bits are determined so as to fulfill the (1, 11) RLL rule at least at the code boundary (step S5).

Next, a method of creating a conversion table will be explained.

As candidate codes in conversion table A, codes with patterns satisfying the following rules are selected:
  1) The number of consecutive "0s" between "1s" is one or more and eleven or less.
  2) The number of consecutive "0s" at the head is 10 or less.
  3) The number of consecutive "0s" at the end is 11 or less.

The number of 12-bit patterns fulfilling the above conditions is 375.

FIG. 3 shows a part of the patterns.

On the other hand, as candidate codes in conversion table B, codes with patterns fulfilling the following rules are selected:
  1) The number of consecutive "0s" between "1s" is one or more.
  2) A pattern which ends with "1" is combined with a pattern which is the same as the former except for the end and has "0" at the end. Then, "0" at the end is replaced with "*" (indefinite). This will be explained in detail later.

There are 13 6-bit patterns that fulfill the above conditions.

FIG. 4 shows those patterns. In FIG. 4, "*" means that it is replaced with either "1" or "0" by a method explained later.

If 375 patterns in conversion table A and 13 patterns in conversion table B can be combined to form patterns, as many patterns as 375×13=4888 can be produced. Actually, however, there are combinations which do not satisfy the conditions for (1, 11) RLL at the junction of two patterns.

Thus, the conversion tables A and conversion tables B are further classified, thereby narrowing the combinations to the ones which fulfill the conditions for (1, 11) RLL.

A method of classifying the conversion tables A will be explained. The conversion tables A are classified into seven conversion tables, conversion table A-1 to conversion table A-7, according to the following condition.

Let conversion table A-1 be a pattern which fulfills the following condition among the candidates for conversion table A:
  1) The number of consecutive "0s" at the end of a pattern is one or more and five or less.
  There are 212 patterns which satisfy this condition.

FIG. 5 shows part of the patterns included in conversion table A-1.

Let conversion table A-2 be a pattern which fulfills the following condition among the candidates for conversion table A:
  1) A pattern ends with "1."
  There are 143 patterns which fulfill this condition.

FIG. 6 shows part of the patterns included in conversion table A-2.

Let conversion table A-3 be a pattern which fulfills the following condition among the candidates for conversion table A:
  1) The number of consecutive "0s" at the end of a pattern is 6 or more or 7 or less.
  There are 13 patterns which fulfill this condition.

FIG. 7 shows the patterns included in conversion table A-3.

Let conversion table A-4 be a pattern which satisfies the following condition among the candidates for conversion table A:
  1) The number of consecutive "0s" at the end of a pattern is 8.
  There are three patterns which fulfill this condition.

FIG. 8 shows the patterns included in conversion table A-4.

Let conversion table A-5 be a pattern which satisfies the following condition among the candidates for conversion table A:
  1) The number of consecutive "0s" at the end of a pattern is 9.
  There are two patterns which fulfill this condition.

FIG. 9 shows the patterns included in conversion table A-5.

Let conversion table A-6 be a pattern which satisfies the following condition among the candidates for conversion table A:
  1) The number of consecutive "0s" at the end of a pattern is 10.
  There is one pattern which fulfills this condition.

FIG. 10 shows the pattern included in conversion table A-6.

Let conversion table A-7 be a pattern which satisfies the following condition among the candidates for conversion table A:
  1) The number of consecutive "0s" at the end of a pattern is 11.
  There is one pattern which fulfills this condition.

FIG. 11 shows the pattern included in conversion table A-7.

Next, a method of combining the conversion tables classified from conversion table A and conversion table B will be explained by reference to FIG. 12.

The number of consecutive "0s" at the head of a pattern in conversion table B is in the range from 0 to 6 including "*." Therefore, even when a code in conversion table B is connected to a code in conversion table A-1, the number of consecutive "0s" at the junction is in the range from 1 to 11. Thus, it is possible to combine all the patterns (or codes) shown in FIG. 4 with the patterns (or codes) in conversion table A-1. As a result, from the combinations of the patterns shown in conversion table B and the patterns shown in conversion table A-1, as many 18-bit patterns as 213×13= 2756 can be produced.

In conversion table A-2, any pattern always ends with "1." To fulfill the conditions for (1, 11) RLL, the five patterns beginning with "1" in conversion table B cannot be connected. Thus, the number of patterns (or codes) connectable with the patterns (or codes) in conversion pattern A-2 is only eight. As a result, from the eight patterns in conversion table B and the patterns shown in conversion table A-2, as many 18-bit patterns as 143×8=1144 can be produced.

Only the twelve patterns where the number of consecutive "0s" at the head of each pattern is four or less in the patterns in conversion table B can be combined with the patterns shown in conversion table A-3. As a result, as many 18-bit patterns as 13×12=156 can be produced.

Only the eleven patterns where the number of consecutive "0s" at the head of each pattern is three or less in the patterns in conversion table B can be combined with the patterns shown in conversion table A-4. As a result, as many 18-bit patterns as 13×11=33 can be produced.

Only the ten patterns where the number of consecutive "0s" at the head of each pattern is two or less in the patterns in conversion table B can be combined with the patterns shown in conversion table A-5. As a result, as many 18-bit patterns as 2×10=20 can be produced.

Only the eight patterns where the number of consecutive "0s" at the head of each pattern is one or less in the patterns in conversion table B can be combined with the patterns shown in conversion table A-6. As a result, as many 18-bit patterns as 1×8=8 can be produced.

Only the five patterns where the ones beginning with "1" of the patterns in conversion table B can be combined with the patterns shown in conversion table A-7. As a result, as many 18-bit patterns as 1×5=5 can be produced.

From the above results, the total number of 18-bit patterns in conversion table A and conversion table B which can be combined is 2756+1144+156+33+20+8+5=4122. The 4122 18-bit patterns are larger in number than the 4096 12-bit input data patterns.

Consequently, it is seen that the 12-bit data can be converted into 18-bit codes with the (1, 11) RLL characteristic. In fact, 4096 combinations are selected from the 4122 combinations of patterns, thereby forming conversion tables.

As described above, under only the condition for code words, 12 bits can be converted into 18 bits.

Next, the state of a connection between 18-bit code words will be explained.

The last two bits in the 6-bit patterns in conversion table B are either "10" or "0*." On the other hand, in conversion table A, data exists in the rang from one to ten consecutive "0s" or "1."

Therefore, when conversion table B ends with "10," the number of consecutive "0s" at the boundary between codes is in the range from one to eleven, which satisfies the rule for (1, 11) RLL. On the other hand, when conversion table B ends with "0*," either "0" or "1" can be selected for "*." Because of this selection, either "0" or "1" can be selected so as to fulfill the rule for (1, 11) RLL.

When the first bit of conversion table A at the code junction is "1," a selection is so made that "*" is always "0." When the number of consecutive "0s" exceeds 11 after "*" is replaced with "0," a selection is so made that "*" is always "1." By making a selection in this way, the rule for (1, 11) can be satisfied.

In a case where the rule for (1, 11) RLL can be fulfilled even if "*" is replaced with "0" or "1," either "0" or "1" may be selected.

As described above, with the data converting method in the embodiment, when a 12-bit data word is converted into an 18-bit code word, the 12-bit data word can be divided into the 8 high-order bits and the 4 low-order bits. Using the conversion tables, the 8 high-order bits are converted into 12 bits and the 4 low-order bits are converted into 6 bits. The 12 bits and the 6 bits are connected in such a manner that the former become the high-order bits and the latter become the low-order bits, thereby creating an 18-bit code.

This makes it possible to convert data words into code words using small conversion tables.

Since information about the result of the past selection is not needed in the process of selecting a conversion table, when a converted code word is restored to the original data word, errors are prevented from propagating from one code to another.

(About DC control method)

In the conversion table of FIG. 12, there may be a case where either "0" or "1" can be selected freely for "*" located at the end of conversion table B. Such a bit is called a DC control bit, which can be used for suppressing the low-frequency components included in the bit sequence of the converted code word.

Next, the method of suppressing the low-frequency components will be explained.

The bit sequence of the code word obtained using the conversion tables is subjected to ZRZI conversion. That is, the code word is inputted to the converting section. When receiving "1" in the code word, the converting section inverts either "0" or "1" presently held on the output side. During the time when "0" continues to arrive, the conversion section keeps the present output "0" or "1." Different recording signal levels are allocated to "0" and "1" after NRZI conversion. By doing this, an actual recording signal is created.

When the value (DSV) is accumulated, taking "0" of the NRZI-converted signal as "−1" and "1" of the signal as "+1," the DSV level presents the direct-current component that the recording signal has and the variable period of the DSV represents the low-frequency components. To suppress the direct-current component and low-frequency components of the recording signal to low levels, it is necessary to make the absolute value of the DSV smaller. Furthermore, shortening the variable period of the DSV enables the low-frequency components to be suppressed to a low level.

Figure 13:
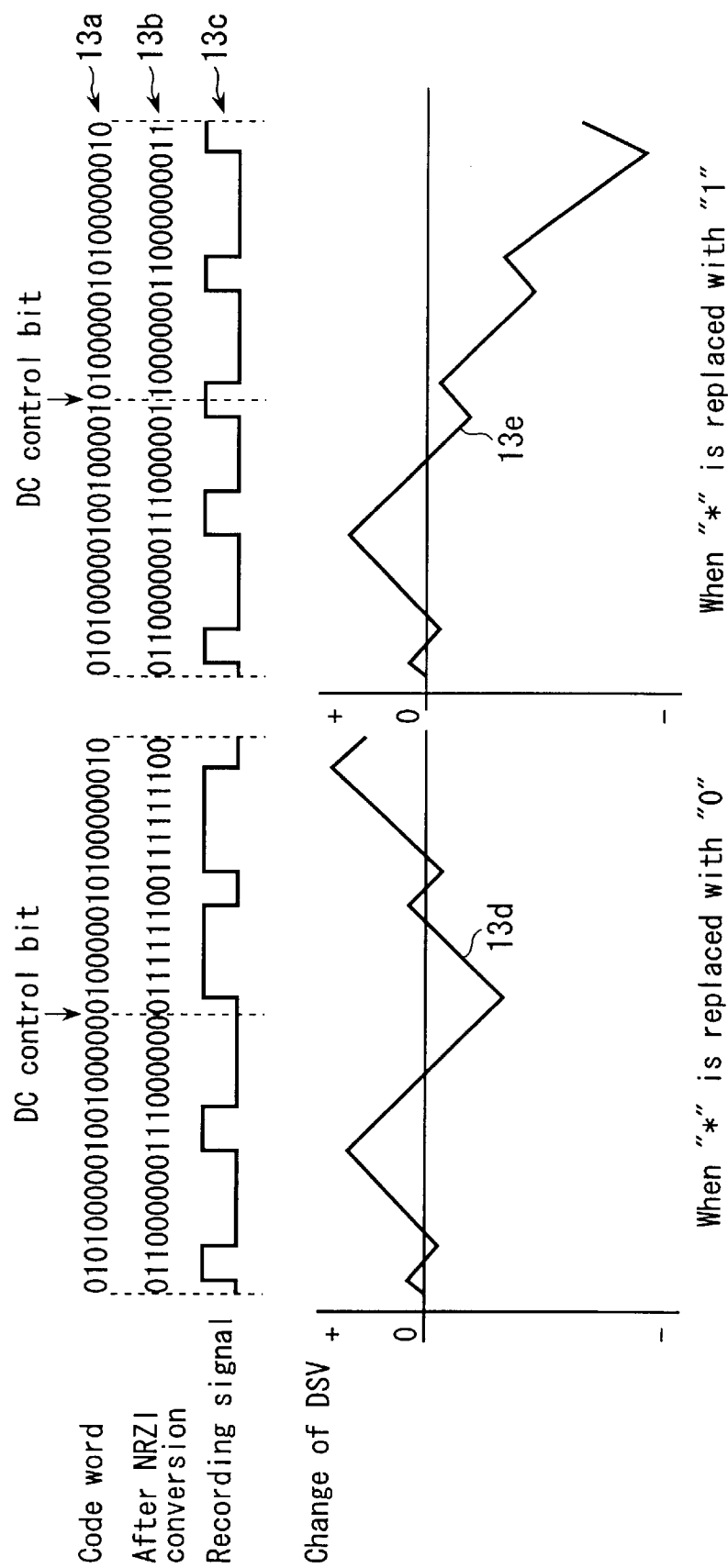
FIG. 13 illustrates an example of DSV control.

FIG. 13 is a diagram to help explain a method of controlling the DSV by using "*" acting as a DC control bit at the end of a pattern in conversion pattern B.

A bit sequence indicated by reference numeral 13*a* in FIG. 13 is a bit sequence of a code word. A bit sequence indicated by reference numeral 13*b* is a data sequence after NRZI conversion. A waveform indicated by reference numeral 13*c* is a recording signal. A case where "*" serving as a DC control bit is "=0" is shown at left of FIG. 13. A case where "*" serving as a DC control bit is "*=1" is shown at right of FIG. 13.

A waveform indicated by reference numeral 13*d* in FIG. 13 shows the way the DSV of the left-side data sequence changes. A waveform indicated by reference numeral 13*e* shows the way the DSV of the right-side data sequence changes.

When only one bit in the code word (13*a*) is inverted from "0" to "1," the signal (13*b*) after NRZI conversion is such that the polarity of the signal after the inverted bit reverses. As shown in FIG. 13, inverting a bit causes the DSV (13*d*, 13*e*) after the inverted bit to change in the opposite direction.

In the example of the code word in FIG. 13, a comparison between the DSVs (13*d*, 13*e*) shown at left and at right has shown that the absolute value of the DSV (13*d*) without bit inversion is smaller.

Therefore, to control the direct-current component of the code word, the DSV with the inversion of the DC control bit and the DSV without the inversion of the DC control bit are calculated. That is, it is determined in advance which is smaller, the absolute value of the DSV with "*" replaced with "0" beforehand or the absolute value of the DSV with "*" being "1." According to the result of the determination, either "0" or "1" is selected for the position where a DC control bit "*" will actually appear next time, in such a manner that the absolute value of the DSV becomes smaller.

In the method of controlling the DC control bit, control may be performed in such a manner that the peak of the absolute value of the DSV until the appearance of the next DC control bit becomes smaller or that the polarity of the DSV is reversed.

(About the limitation on the number of consecutive detailed patterns)

In the conversion table of FIG. 12, there are 4122 combinations of code words for 4096 input data items. Therefore, there are still 26 combinations left. By suitably selecting unused 26 patterns from the 4122 patterns, the conversion table can be optimized.

Hereinafter, a selecting method for using unused pattern effectively will be explained.

The optical resolution characteristic of optical disks is such that, as the length of a pit becomes shorter, the amplitude of the reproduced signal decreases and the reliability of the recorded data is impaired. Therefore, a succession of short pits results in a decrease in the signal amplitude for a long time. Such a phenomenon is undesirable for the signal reproducing function.

By removing patters with a succession of short pits, a more suitable bit sequence can be created. In the (1, 11) RLL characteristic, the shortest pit, which is as long as 2 bits (2T), appears in the place where only one "0" is sandwiched between "1" and "1." Thus, by removing patterns where "1" and "0" appear alternately from the conversion tables, short pits are prevented from appearing consecutively.

FIG. 14 shows the combinations of patterns practically removed from the conversion tables.

A first to a thirteenth combination of code patterns are combinations of patterns removed to limit the number of repetitions of "1" and "0" on the head side of the pattern to less than four. A fourteenth to a seventeenth combination of code patterns are combinations of patterns extracted to limit the number of repetitions of "1" and "0" on the end side of the pattern to six or less.

These 17 combinations are removed from the conversion tables. Moreover, when replacing a "*" with "1" in the conversion table causes the number of repetitions of "1" and "0" to exceed 10, a rule that the "*" never fails to be replaced with "0" is set. Setting the rule enables repetitions of "1" and "0" to be limited to 10 or less consecutive ones.

Since the combinations of the patterns to be recorded shown in FIG. 14 are smaller in number than the 26 unused patterns in the conversion table shown in FIG. 12, even if the patterns shown in FIG. 14 are removed, it is sufficiently possible to convert 12-bit data into 18-bit codes.

(About the configuration of the converting circuit)

Using FIG. 15, the converting circuit that realizes data conversion in the present invention will be explained.

The data normally inputted in bytes from an input terminal 100 is reconstructed into a data word in units of 12 bits at a data word constructing section 101.

Figure 16A:
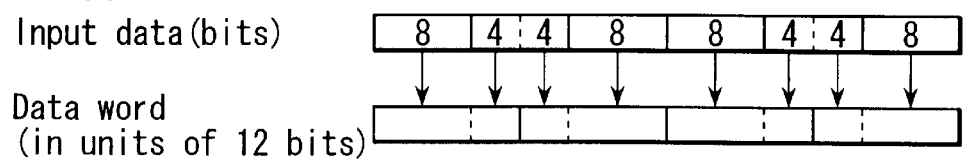
FIGS. 16A and 16B are illustrations to help explain a method of forming a data word.
Figure 16B:
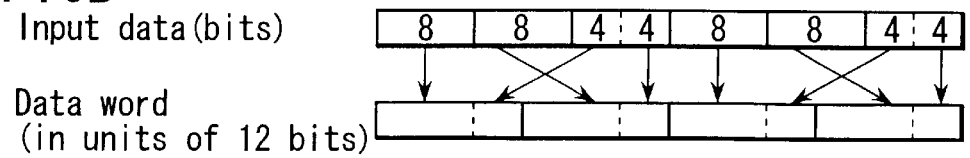

FIG. 16A and FIG. 16B show a method of reconstructing the data. One reconstructing method is to arrange 3-byte input data items (=8×3=24 bits) one after another, thereby segmenting the data in units of 12 bits as shown in FIG. 16A. In the example of FIG. 16A, a first 8-bit unit, a second 8-bit unit, and a third 8-bit unit are arranged, with the second 8-bit unit being halved. Then, the divided first 4 bits are connected to the first 8-bit unit and the divided second 4 bits are connected to the third 8-bit unit.

In FIG. 16B, the third 8-bit unit is halved. Then, the divided first 4 bits are connected to the end of the first 8-bit unit and the divided second 4 bits are connected to the end of the second 8-bit unit.

Figure 15:
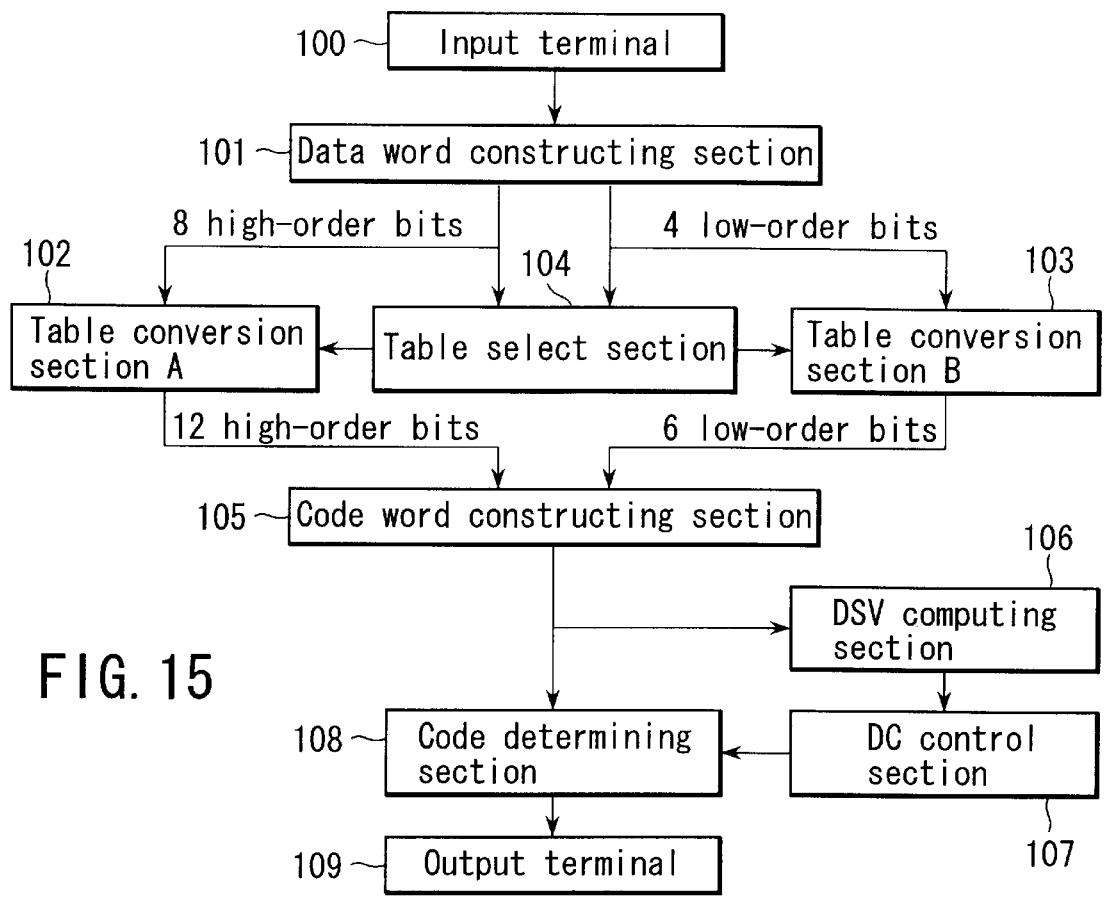
FIG. 15 is a block diagram of a circuit for converting data words into code words.

The 8 high-order bits in the 12-bit data outputted from the data word constructing section 101 of FIG. 15 are given to a table conversion section (A) 102 and the 4 low-order bits are given to a table conversion section (B) 103. At the same time, the 12-bit data is given to a table select section 104.

The table conversion section (A) 102 includes a plurality of conversion tables for converting 8-bit data words into 12-bit code words. The table conversion section (A) 102 receives a table select signal generated at the table select section 104 and carries out pattern conversion using a suitable conversion table on the basis of the table select signal.

Similarly, the table conversion section (B) 103 includes a plurality of conversion tables for converting 4-bit data words into 6-bit code words. The table conversion section (B) 103 receives a table select signal generated at the table select section 104 and carries out pattern conversion using a suitable conversion table on the basis of the table select signal.

Part of the patterns in the conversion tables of the table conversion section (B) 103 end with DC control bits. The DC control bits can be replaced with either "0" or "1."

On the basis of a predetermine rule, the table select section 104, according to the 12-bit input data, generates a specify signal for selecting a conversion table used in the table conversion section (A) 102 and table conversion section (B).

The code word constructing section 105 uses the 12 bits outputted from the table conversion section (A) 102 as the high-order bits and the 6 bits outputted from the table conversion section (B) 103 as the low-order bits, thereby creating a code word containing 18 bits in total.

The output of the code word constructing section 105 is supplied to a digital sum value (DSV) computing section 106. The DSV computing section 106 senses the direct-current (DC) component included in the bit sequence of a word code. When the bit sequence of the code word is subjected to NRZI conversion, the DC component can be calculated by accumulating the values, taking "0" as "−1" and "1" as "+1." The calculated DSV value is supplied to a DC control section 107. The DC control section 107 executes a specific algorithm, and outputs, for example, information for selecting a DC control bit so that the absolute value of a DVD may become smaller.

The control information, which is inputted to a code determining section 108, is used for determining whether to replace the DC control bit included together with the code connection condition with either "0" or "1." The determined code is outputted at an output terminal 109.

When a 12-bit data word is converted into an 18-bit code word, using directly a single conversion table makes the size of conversion table very large. However, use of the converting circuit with the configuration of FIG. 15 enables small conversion tables to be combined, which makes it possible to convert the data with the small-scale circuit.

In the embodiment, when a 12-bit data word is converted into an 18-bit code word, the 12-bit data word is divided in such a manner that the 8 high-order bits are converted into 12 bits and the 4 low-order bits are converted into 6 bits. However, the dividing method is not limited to this combination. For instance, a 12-bit data word may be divided into the 4 high-order bits and the 8 low-order bits or into the 10 high-order bits and the 2 low-order bits. Although a DC control bit is placed at the end of the low-order pattern, it is not limited to this position.

As for the number of bits in a data word and a code word and the conversion ratio of them, the present invention may be applied to other combinations. For instance, a similar method according to this invention may be applied to a case where a 16-bit data word is converted into a 24-bit code word. While in the embodiment, the created code word has the (1, 11) RLL characteristic, it may have a different characteristic. Since the optimum characteristic changes as the conversion ratio changes, the characteristic of the created code word is not limited to a particular characteristic.

In the embodiment, the bit dividing position is not limited. Even when the high-order and low-order in each conversion table are reversed and the high-order bits and the low-order bits are inverted in each conversion table, an effect equivalent to the effect of the embodiment is produced. In that case, a DC control bit appears at the first bit of the code word after the conversion.

As described above, a first main point of the present invention is as follows.

When a 12-bit data word is converted into an 18-bit code word, the 12-bit data word is divided into the 8 high-order bits and the 4 low-order bits. The 8 high-order bits are converted into 12 bits and the 4 low-order bits are converted into 6 bits, thereby creating an 18-bit code, which enables conversion using a small-scale conversion table.

Specifically, in the data encoding method of converting an L-bit data word into an $\alpha$L-bit code word, the L-bit data word is divided into an M-bit data word and an N-bit data word (M$\geq$N), the M-bit data word is converted into a $\beta$M-bit code word using a first conversion table, the N-bit data word is converted into a $\gamma$N-bit code word using a second conversion table, and the $\beta$M-bit code word is connected to the $\gamma$N-bit code word, with the result that the L-bit data word is converted into the $\alpha$L-bit code word.

The first conversion table is further composed of a plurality of conversion tables. The second conversion table is further composed of a plurality of conversion tables. A method of selecting the first and second conversion tables is determined by a combination of an M-bit data word and an N-bit data word.

Converting an L-bit data word directly into an $\alpha$L-bit code word makes the conversion table larger. However, as explained in the invention, a data word is divided into suitable sets of bits. After the divided patterns are connected using different conversion tables, the resulting patterns are combined, which enables the data to be converted using small conversion tables.

Furthermore, the present invention makes NRZI conversion easier. That is, an $\alpha$L-bit code word is subjected to NRZI conversion. In NRZI conversion, the output is inverted when "1" appears, whereas the output remains unchanged when "0" appears.

In this invention, it is easy to control the digital sum value of an $\alpha$L-bit code word, or perform direct-current (DC) control. To realize this, 1) one conversion table includes DC control bits; 2) the DC control bits are included in a part of the code words in a second conversion table; and 3) each DC control bit is placed at the end of a code word.

In this invention, DC control is performed by selecting either "0" or "1" for one bit in the code word. One method of selecting a DC control bit is to accumulate the value, taking "0" in an $\alpha$L-bit word code as "−1" and "1" as "+1," and select DC control bits in such a manner that the absolute value of the accumulated value becomes smaller. Another method of selecting a DC control bit is to calculate the value, taking "0" in an $\alpha$L-bit word code as "−1" and "1" as "+1," and select DC control bits in such a manner that the signs of the accumulated values are inverted one after another in $\alpha$L-bit word codes. When the signs are the same, DC control bits are selected in such a manner that the absolute values become smaller.

Concentrating DC control bits into one divided conversion table (or table B) makes the select algorithm for the conversion table and DC control easier.

In this invention, the data conversion tables are characterized in that 1) a code word in the first conversion table includes at least one "1" and that 2) an $\alpha$L-bit code word includes a part where at least two "0s" are consecutive.

Furthermore, the conditions for L, M, N, $\alpha$, $\beta$, and $\gamma$ are characterized in that 1) L bits are divided into M bits as the high-order bits and N bits as the low-order bits and $\alpha$L bits are divided into $\beta$M bits as the high-order bits and $\gamma$N bits as the low-order bits, where M is a multiple of 8 and $\alpha$ is 2 or less. In addition, $\beta$M is larger in number than the maximum number of consecutive "0s" appearing in the bit sequence after the conversion. Moreover, $\alpha$, $\beta$, and $\gamma$ fulfill the expression $\alpha=\beta=\gamma$. Specifically, L is 12, M is 8, N is 4, and $\alpha$, $\beta$, and $\gamma$ are each 1.5.

The present invention is not limited to the above embodiment. In the explanation, the data to be recorded on a recording medium has been encoded. This invention, of course, may be applied to a case where the data is encoded and the encoded data is transmitted over a channel (by wireless, by wire, by light, or the like).

Figure 17:
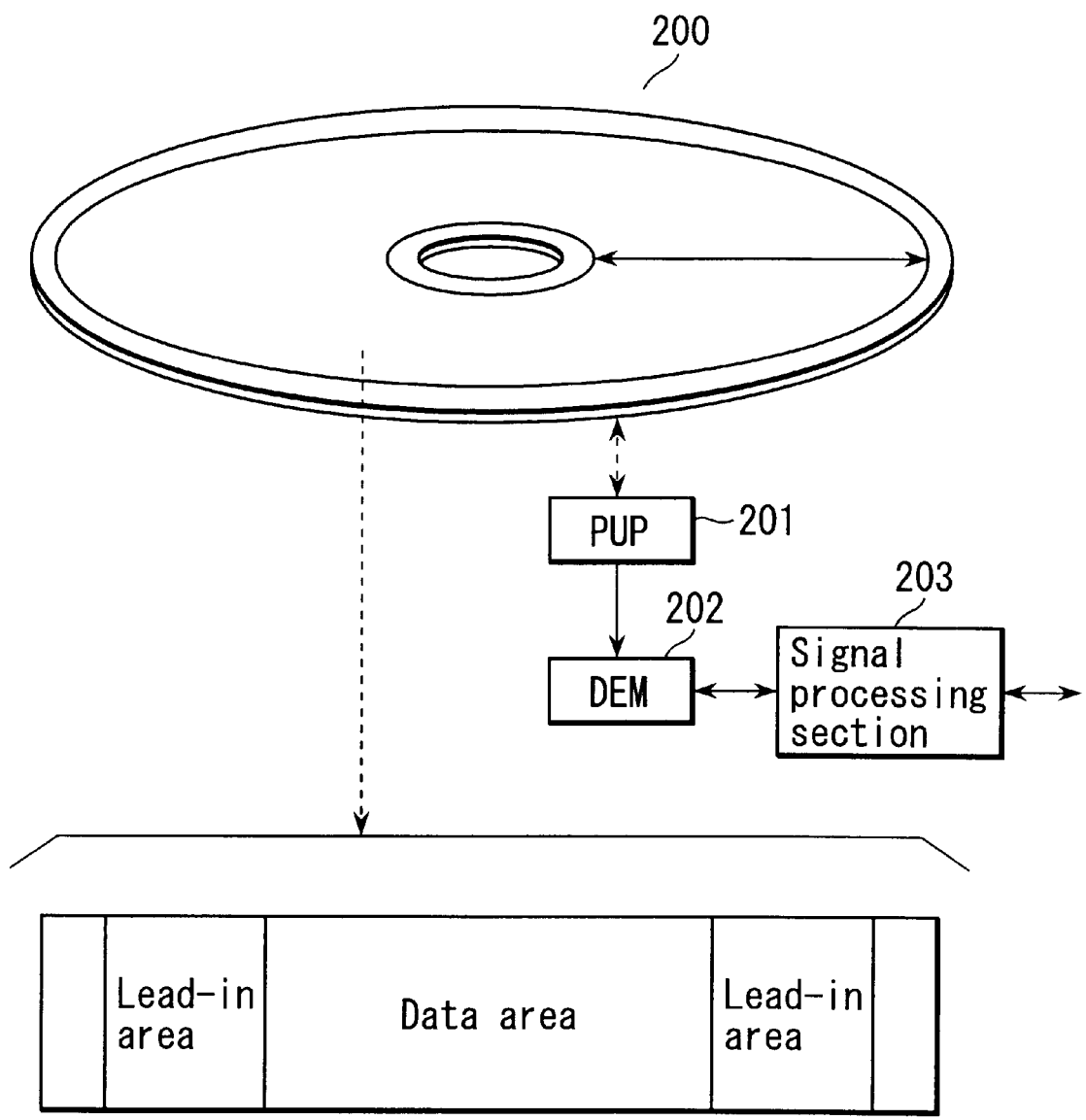
FIG. 17 is a diagram to help explain an information medium recording/reproducing apparatus to which the present invention is applied.

FIG. 17 shows a recording/reproducing disk 200 on which data is recorded by the data encoding method of the present invention and a pickup head 201 which projects a write laser beam or a read laser beam onto the information recording surface of the disk 200. A modulation/demodulation section 203 is connected to the pickup head 201. In a recording operation, the modulation/demodulation section 203 subjects the data supplied from a signal processing section 204 to 12/28 modulation by the above-described encoding method and supplies the resulting output to the pickup head 201. To demodulate the reproduced high-frequency signal outputted from the pickup head 201, the reproduced high-frequency signal is binarized to demodulate the 18-bit signal into a 12-bit signal. At this time, a converting process opposite to the aforementioned encoding process is carried out. In this converting process, the input data is just converted using a suitable table.

The signal processing section is a circuit which encodes and decodes, for example, audio data, movie video data, and still video data. The signal processing section may include a signal transmission/reception section. The optical disk has an information recording area (or data area). The data recorded in the area is the data encoded as described above.

While in the explanation, the optical disk has been used as an information medium, a semiconductor memory or a transmission line, etc., may of course, be used as the information medium.

One way of using a storage medium, such as an optical disk or a semiconductor memory, involves the user recording/reproducing content (e.g., video information, audio information, or update information) using the apparatus. The fixed information may also be recorded in advance on the storage medium manufacturing side. The fixed information includes management information for system management. Therefore, the fixed information is, of course, recorded using the encoding method of the present invention.

The above embodiment not only lowers the operating frequency of the recording/reproducing signal processing circuit but also prevents the memory capacity from being wasted on the recording medium side, and provides stable tracking.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data encoding method of converting an L-bit data word into an αL-bit code word, comprising:
dividing said L-bit data word into an M-bit data word and an N-bit data word (M≧N);
converting said M-bit data word into a βM-bit code word whose pattern is based on the content created by combining said M-bit date word with said N-bit data word by reference to a first conversion table;
converting said N-bit data word into a γN-bit code word whose pattern is based on the content created by combining said M-bit data word with said N-bit data word by reference to a second conversion table; and
connecting said βM-bit code word to said γN-bit code word to convert into said αL-bit code word.

2. The data encoding method according to claim 1, further comprising
inverting the output state when the output of said αL-bit code word is "1" and performing NRZI conversion that causes the output state to remain unchanged, when the output of said αL-bit code word is "0."

3. The data encoding method according to claim 1, wherein part of the word codes (each containing γN bits) in said second conversion table include direct-current (DC) control bits for controlling the digital sum value of the word code (containing αL bits), when said αL-bit word code is created.

4. The data encoding method according to claim 3, wherein said DC control bits are the end bits of said part of the word codes (each containing γN bits).

5. The data encoding method according to claim 1, wherein said αL-bit word code, when being created, includes one direct-current (DC) control bit for controlling the digital sum value of the word code (containing αL bits), with the control bit being replaced with either "0" or "1."

6. The data encoding method according to claim 5, wherein said DC control bit is replaced with either "0" or "1" in such a manner that values are accumulated, "0" in said αL-bit word code being taken as "−1" and "1" being taken as "+1," and that the absolute value of the accumulated value becomes smaller.

7. The data encoding method according to claim 5, wherein said DC control bit is replaced with either "0" or "1" in such a manner that values are accumulated, "0" in said αL-bit word code being taken as "−1" and "1" being taken as "+1," and the sign of the accumulated value is so selected that it is inverted in units of said αL-bit word code and that, when the signs of the accumulated values are the same consecutively, the absolute value of the accumulated value becomes smaller.

8. The data encoding method according to claim 1, wherein a code word in said first conversion table includes at least one "1" and said αL-bit code word includes at least a part where two or more "0s" are consecutive.

9. The data encoding method according to claim 1, wherein the high-order bits of said L bits are set to M bits and the low-order bits of them are set to N bits and the high-order bits of said αL bits are set to βM bits and the low-order bits of them are set to γN bits.

10. The data encoding method according to claim 9, wherein said M is a multiple of 8, said α is 2 or less, said βM is larger than the maximum number of consecutive "0s" appearing in the bit sequence after the conversion, and the expression α=β=γ holds.

11. The data encoding method according to claim 10, wherein said L is 12, said M is 8, said N is 4, and each of α, β, γ is 1.5.

12. A data encoding apparatus for converting an L-bit data word into an αL-bit code word, comprising:
means for dividing said L-bit data word into an M-bit data word and an N-bit data word (M≧N);
means for converting said M-bit data word into a βM-bit code word whose pattern is based on the content created by combining said M-bit data word with said N-bit data word by reference to a first conversion table;
means for converting said N-bit data word into a γN-bit code word whose pattern is based on the content created by combining said M-bit data word with said N-bit data word by reference to a second conversion table; and
means for connecting said βM-bit code word to said γN-bit code word to convert into said αL-bit code word.

13. The data encoding apparatus according to claim 12, further comprising
means for inverting the output state when the output of said αL-bit code word is "1" and performing NRZI conversion that causes the output state to remain unchanged, when the output of said αL-bit code word is "0."

14. The data encoding apparatus according to claim 12, further comprising means for replacing a direct-current (DC) control bit with either "0" or "1", wherein, when said αL-bit word code is created, the DC control bit for controlling the digital sum value of the word code (containing αL bits) is included in the word code.

15. The data encoding apparatus according to claim 14, wherein said means for replacing said DC control bit with either "0" or "1" accumulates values, taking "0" in said αL-bit word code as "−1" and "1" as "+1," and replaces the DC control bit with either "0" or "1" in such a manner that the absolute value of the accumulated value becomes smaller.

16. The data encoding apparatus according to claim 14, wherein said means for replacing said DC control bit with either "0" or "1" accumulates values, taking "0" in said αL-bit word code as "−1" and "1" as "+1" and replaces the DC control bit with either "0" or "1" in such a manner that the sign of the accumulated value is inverted in units of said αL-bit word code and, when the signs of the accumulated values are the same consecutively, replaces the DC control bit with either "0" or "1" in such a manner that the absolute value of the accumulated value becomes smaller.

17. A data encoding method for data recording, wherein the data encoding method according to claim 1 is used in supplying data to an information medium.

18. A data encoding apparatus for information recording, wherein the data encoding apparatus according to claim 12 is used as an apparatus for supplying data to an information medium.

19. A data encoding method of converting an L-bit data word into an αL-bit code word and supplying the αL-bit code word to an information medium, said data encoding method comprising:

dividing said L-bit data word into an M-bit data word and an N-bit data word (M≧N);

converting said M-bit data word into a βM-bit code word whose pattern is based on the content created by combining said M-bit data word with said N-bit data word by reference to a first conversion table;

converting said N-bit data word into a γN-bit code word whose pattern is based on the content created by combining said M-bit data word with said N-bit data word by reference to a second conversion table; and connecting said βM-bit code word to said γN-bit code word to convert into said αL-bit code word.

20. A data encoding apparatus for converting an L-bit data word into an αL-bit code word and supplying the αL-bit code word to an information medium, said data encoding apparatus comprising:

means for dividing said L-bit data word into an M-bit data word and an N-bit data word (M≧N);

means for converting said M-bit data word into a βM-bit code word whose pattern is based on the content created by combining said M-bit data word with said N-bit data word by reference to a first conversion table;

means for converting said N-bit data word into a γN-bit code word whose pattern is based on the content created by combining said M-bit data word with said N-bit data word by reference to a second conversion table; and means for connecting said βM-bit code word to said γN-bit code word to convert into said αL-bit code word.

21. A recording medium on which an αL-bit code word is recorded, said αL-bit code word being created by a method comprising:

dividing an L-bit data word into an M-bit data word and an N-bit data word (M≧N);

converting said M-bit data word into a βM-bit code word whose pattern is based on the content created by combining said M-bit data word with said N-bit data word by reference to a first conversion table;

converting said N-bit data word into a γN-bit code word whose pattern is based on the content created by combining said M-bit data word with said N-bit data word by reference to a second conversion table; and connecting said βM-bit code word to said γN-bit code word to convert into the αL-bit code word.

22. The recording medium according to claim 21, wherein said αL-bit code word is recorded as management information.

* * * * *